(12) United States Patent
Liang et al.

(10) Patent No.: US 10,718,811 B2
(45) Date of Patent: Jul. 21, 2020

(54) JITTER MEASUREMENT CIRCUIT AND JITTER MEASUREMENT SYSTEM

(71) Applicant: FUJITSU LIMITED, Kawasaki-shi, Kanagawa (JP)

(72) Inventors: Joshua Liang, Toronto (CA); Ali Sheikholeslami, Toronto (CA); Sanroku Tsukamoto, Setagaya (JP); Hirotaka Tamura, Yokohama (JP); Hisakatsu Yamaguchi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 220 days.

(21) Appl. No.: 15/960,629

(22) Filed: Apr. 24, 2018

(65) Prior Publication Data

US 2018/0313895 A1    Nov. 1, 2018

(30) Foreign Application Priority Data

Apr. 28, 2017   (JP) .................................. 2017-089763

(51) Int. Cl.
  *G01R 31/317*   (2006.01)
  *G01R 25/04*    (2006.01)

(52) U.S. Cl.
  CPC ....... *G01R 31/31709* (2013.01); *G01R 25/04* (2013.01)

(58) Field of Classification Search
  CPC .......................... G01R 31/31709; G01R 25/04
  See application file for complete search history.

(56) References Cited

U.S. PATENT DOCUMENTS

| 7,020,227 B1 * | 3/2006 | Wang .................... H04L 7/0337 375/261 |
| 2010/0097071 A1 * | 4/2010 | Lee .................. G01R 31/31725 324/537 |
| 2014/0269872 A1 | 9/2014 | Onodera |

FOREIGN PATENT DOCUMENTS

| JP | 2010-273322 | 12/2010 |
| JP | 2014-174131 | 9/2014 |

OTHER PUBLICATIONS

Liang et al., On-Chip Measurement of Clock and Data Jitter With Sub-Picosecond Accuracy for 10 Gb/s Multilane CDRs, IEEE Journal of Solid-State Circuits, vol. 50, No. 4, Apr. 2015 (Year: 2015).*

(Continued)

*Primary Examiner* — Daniel R Miller
(74) *Attorney, Agent, or Firm* — Fujitsu Patent Center

(57) ABSTRACT

A jitter measurement circuit includes an addition circuit to add a digital rectangular signal to an adjustment signal generated by a circuit that generates a first error signal based on a phase difference between a first clock signal or a data signal on which the first clock signal is superimposed and a second clock signal and generates the adjustment signal by filtering the first error signal, and a calculation circuit to calculate a first correlation value for representing an autocorrelation of the first error signal when the rectangular signal is not added to the adjustment signal, and a second correlation value for representing the autocorrelation when the rectangular signal is added to the adjustment signal, based on the first error signal and a second error signal obtained by delaying the first error signal by a variable delay amount, and output the first correlation value and the second correlation value.

8 Claims, 17 Drawing Sheets

(56) References Cited

OTHER PUBLICATIONS

M. J. Park et al., "Pseudo-Linear Analysis of Bang-Bang Controlled Timing Circuits," IEEE Transactions on Circuits and Systems I: Regular Papers, vol. 60, No. 6, pp. 1381-1394 (14 pages), Jun. 2013.

* cited by examiner

FIG. 4

| Input | | | Output |
|---|---|---|---|
| A | T | B | |
| 0 | 0 | 0 | 00(0) |
| 0 | 0 | 1 | 01(-1) |
| 0 | 1 | 0 | 11(0) |
| 0 | 1 | 1 | 10(+1) |
| 1 | 0 | 0 | 10(+1) |
| 1 | 0 | 1 | 11(0) |
| 1 | 1 | 0 | 01(-1) |
| 1 | 1 | 1 | 00(0) |

US 10,718,811 B2

JITTER MEASUREMENT CIRCUIT AND JITTER MEASUREMENT SYSTEM

CROSS-REFERENCE TO RELATED APPLICATION

This application is based upon and claims the benefit of priority of the prior Japanese Patent Application No. 2017-089763, filed on Apr. 28, 2017, the entire contents of which are incorporated herein by reference.

FIELD

The embodiments discussed herein are related to a jitter measurement circuit and a jitter measurement system.

BACKGROUND

A clock generation circuit for generating a clock signal to be used for data reception is used in a reception circuit used for communication inside a large scale integrated circuit (LSI) chip (hereinafter abbreviated as a "chip") or communication between chips. As the clock generation circuit, there is a clock data recovery (CDR) circuit for recovering a value (data) and a clock signal from a data signal. In the CDR circuit, in order to perform data determination (sampling) at an appropriate timing, a phase difference between the clock signal for data determination and the data signal is detected, and the phase of the clock signal is adjusted.

In recent years, with improvement in the performance of information processing apparatuses such as communication trunk apparatuses and servers, the information processing speed in an apparatus and in a chip has also been increased and the data rate of a data signal transmitted in the apparatus has become high. With the increase in the data rate, the fluctuation (jitter) of the data signal or the clock signal in the time axis direction has a greater influence on a bit error rate (BER) which is an index as to whether or not the value of the data signal may be correctly determined.

In order to detect a BER, there has been conventionally proposed a CDR circuit including an eye monitor function. The eye monitor function is implemented by, for example, a circuit (eye sampler) that determines the value of a data signal using a clock signal that may be adjusted in phase, which is different from the clock signal used in the phase control circuit described above, or a circuit that calculates the BER based on an output value of the eye sampler.

Related techniques are disclosed in, for example, Japanese Laid-Open Patent Publication No. 2014-174131.

SUMMARY

According to an aspect of the invention, a jitter measurement circuit includes an addition circuit configured to add a digital rectangular signal to an adjustment signal generated by a clock generation circuit that generates a first error signal based on a phase difference between a first clock signal or a data signal on which the first clock signal is superimposed and a second clock signal and generates the adjustment signal by filtering the first error signal, the clock generation circuit adjusting a phase or a frequency of the second clock signal based on the adjustment signal, and a calculation circuit configured to calculate a first correlation value for representing an autocorrelation of the first error signal when the digital rectangular signal is not added to the adjustment signal, and a second correlation value for representing the autocorrelation when the digital rectangular signal is added to the adjustment signal, based on the first error signal and a second error signal obtained by delaying the first error signal by a variable delay amount, and output the first correlation value and the second correlation value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a view illustrating an example of input/output of an error signal generation circuit;

DESCRIPTION OF EMBODIMENTS

With the conventional eye monitor function, it is impossible to directly measure a jitter which causes a problem in a clock generation circuit. This is because, for example, in a CDR circuit including the conventional eye monitor function, BER is detected using a circuit separate from a circuit which actually controls the phase of a clock signal used for data determination, and a jitter is obtained based on the BER. Since the BER is affected by a noise (error in a voltage direction) in addition to the jitter, the jitter obtained based on BER may be different from a jitter to be measured.

Hereinafter, embodiments of the present disclosure capable of directly measuring a jitter will be described with reference to the drawings.

First Embodiment

Figure 1:
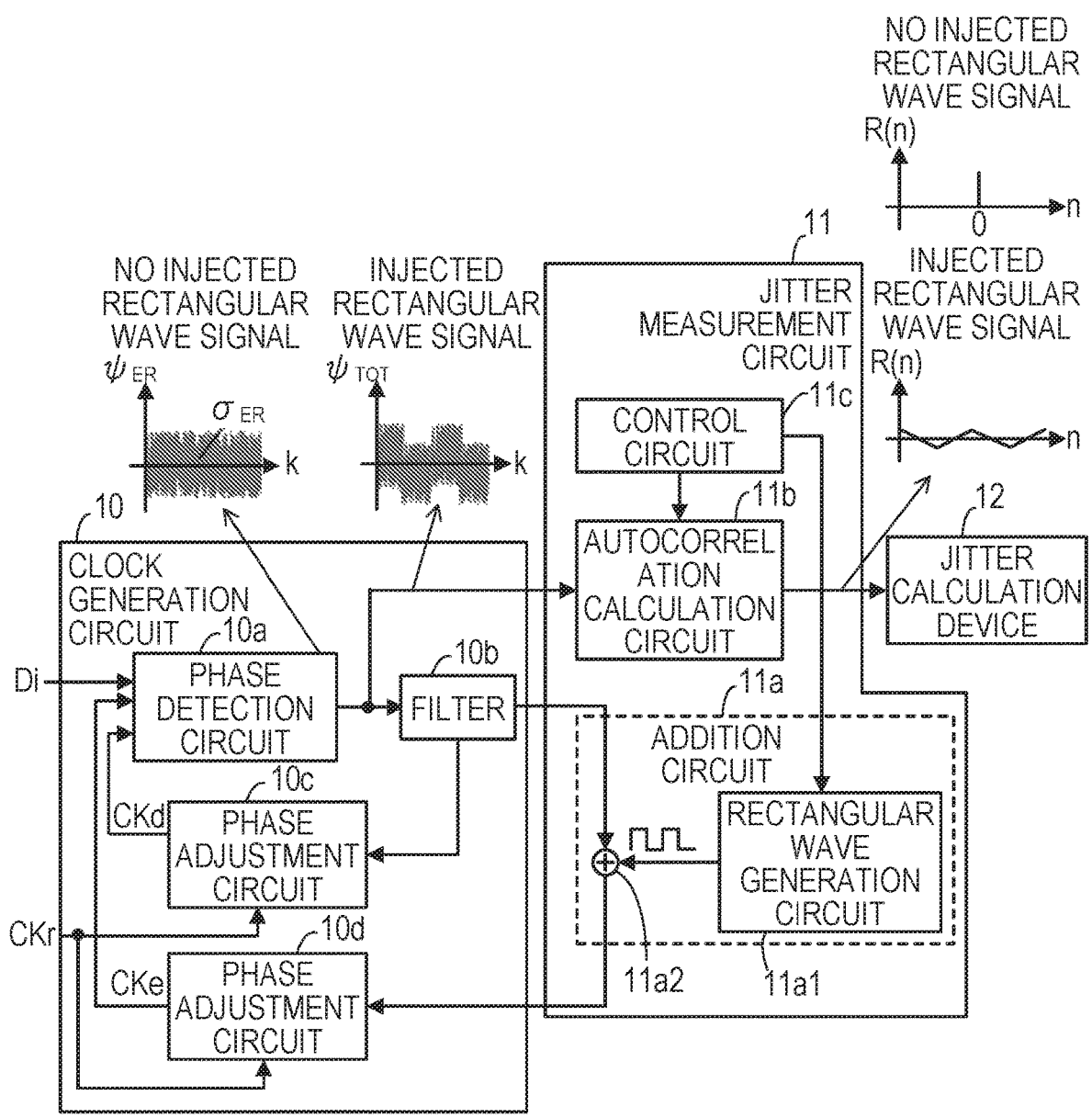
FIG. 1 is a view illustrating an example of a jitter measurement system including a jitter measurement circuit according to a first embodiment.

FIG. 1 is a view illustrating an example of a jitter measurement system including a jitter measurement circuit according to a first embodiment. The jitter measurement system includes a clock generation circuit 10 and a jitter calculation device 12, in addition to a jitter measurement circuit 11.

In the example of FIG. 1, the clock generation circuit 10 functions as a CDR circuit that performs sampling twice per one symbol (also referred to as 1 unit interval (UI)) of a data signal Di. The clock generation circuit 10 uses a clock signal CKe different from a clock signal CKd for data determination in order to detect an edge portion (zero crossing point) of the data signal Di. Then, based on the amplitude level of the data signal Di at a timing synchronized with the clock signal CKe, the clock generation circuit 10 performs adjustment such that the timing is locked to the zero crossing point. The clock signal CKd for data determination is adjusted such that the phase thereof is shifted by 0.5 UI from the clock signal CKe.

In order to execute the above-described function, the clock generation circuit 10 includes a phase detection circuit 10a, a filter 10b, and phase adjustment circuits 10c and 10d. The phase detection circuit 10a receives the data signal Di on which a clock signal is superimposed, and the clock signals CKd and CKe. Then, the phase detection circuit 10a generates and outputs an error signal based on a phase difference between the data signal Di and the clock signal CKe. In the example of FIG. 1, the phase detection circuit 10a is a Bang-Bang type phase detection circuit. An example of the Bang-Bang type phase detection circuit will be described later (see FIG. 2).

The filter 10b is, for example, a digital loop filter, which filters the error signal output from the phase detection circuit 10a and outputs an adjustment value (digital value). The phase adjustment circuit 10c adjusts the phase of the clock signal CKd based on the adjustment value output from the filter 10b. The phase adjustment circuit 10d adjusts the phase of the clock signal CKe based on the adjustment value output from the filter 10b. In the example of FIG. 1, the phase adjustment circuits 10c and 10d generate the clock signals CKd and Cke based on a reference clock CKr. A rectangular wave signal based on a digital value may be added to the adjustment value supplied to the phase adjustment circuit 10d, depending on the function of the jitter measurement circuit 11 to be described later.

The jitter measurement circuit 11 includes an addition circuit 11a, an autocorrelation calculation circuit 11b, and a control circuit 11c. The addition circuit 11a adds the rectangular wave signal based on the digital value to the adjustment value generated and output by the filter 10b. In the example of FIG. 1, the addition circuit 11a has a rectangular wave generation circuit 11a1 and an adder 11a2.

The rectangular wave generation circuit 11a1 generates a rectangular wave signal having predetermined frequency and amplitude under the control of the control circuit 11c. For example, when the amplitude is m, the rectangular wave signal is a signal in which m and 0 are repeated with a duty ratio of 50%. The rectangular wave signal may be supplied from the outside of the jitter measurement circuit 11 (e.g., the outside of the chip).

The adder 11a2 adds the rectangular wave signal to the adjustment value. A switch whose on/off operation is controlled by the control circuit 11c may be interposed between the rectangular wave generation circuit 11a1 and the adder 11a2. In that case, whether or not the rectangular wave signal is added to the adjustment value is controlled by the on/off operation of the switch.

The autocorrelation calculation circuit 11b receives the error signal output from the phase detection circuit 10a, and calculates and outputs a correlation value representing the autocorrelation of the received error signal based on the received error signal and an error signal obtained by delaying the received error signal by a variable delay amount.

The autocorrelation calculation circuit 11b calculates and outputs both a correlation value obtained when the rectangular wave signal is not added to the adjustment value and a correlation value obtained when the rectangular wave signal is added to the adjustment value. The correlation value R(n) obtained when the delay amount is n is an average value of the products of $PD_{OUT}(k)$ and $PD_{OUT}(k-n)$ as expressed by the following equation (1).

$$R(n)=E[PD_{OUT}(k)PD_{OUT}(k-n)] \quad (1)$$

$PD_{OUT}(k)$ represents an error signal output by the phase detection circuit 10a in response to the $k^{th}$ clock cycle of the clock signal Cke, and $PD_{OUT}(k-n)$ represents an error signal output by the phase detection circuit 10a in response to the $(k-n)^{th}$ clock cycle of the clock signal CKe. That is, $PD_{OUT}(k)$ is an error signal delayed by the delay amount n with respect to $PD_{OUT}(k-n)$.

The correlation value reflects a jitter $\psi_{ER}$ which is the fluctuation of the phase of the clock signal CKe in the time axis direction with respect to the data signal Di. The jitter $\psi_{ER}$ may also be said to be a difference between the jitter of the data signal Di and the jitter of the clock signal CKe. FIG. 1 illustrates a change in the jitter $\psi_{ER}$ when no rectangular wave signal is added (when no rectangular wave signal is added to the adjustment value). In such a case, the correlation value R(n) is a value other than 0 only when n=0.

Meanwhile, when the rectangular wave signal is being added, a jitter $\psi_{TOT}$ of the error signal output by the phase detection circuit 10a has such a value that the jitter $\psi_{ER}$ is superimposed on the rectangular wave signal, as illustrated in FIG. 1 (a jitter occurring in the phase detection circuit 10a is also added, as will be described later). In such a case, the correlation value R(n) becomes a triangular wave, as illustrated in FIG. 1.

When the autocorrelation calculation circuit 11b calculates and outputs the correlation value R(n) when no rectangular wave signal is added and the correlation value R(n) when the rectangular wave signal is added, the jitter calculation device 12 may calculate the effective value (standard deviation) $\sigma_{ER}$ of the jitter $\psi_{ER}$. The reason for this will be described later.

The control circuit 11c supplies a control signal for changing the delay amount n to the autocorrelation calculation circuit 11b. Further, the control circuit 11c controls whether or not the rectangular wave generation circuit 11a1 outputs a rectangular wave signal.

Instead of the control circuit 11c, for example, a control device (e.g., the jitter calculation device 12) outside the jitter measurement circuit 11 may perform the same processing as the control circuit 11c. The jitter calculation device 12 calculates the effective value $\sigma_{ER}$ of the jitter $\psi_{ER}$ based on the correlation value output by the autocorrelation calculation circuit 11b. The jitter calculation device 12 may be, for example, a computer (e.g., a personal computer) or may be, for example, a processor installed on the same substrate (or chip) as the clock generation circuit 10 and the jitter measurement circuit 11.

Example of Phase Detection Circuit 10a

Figure 2:
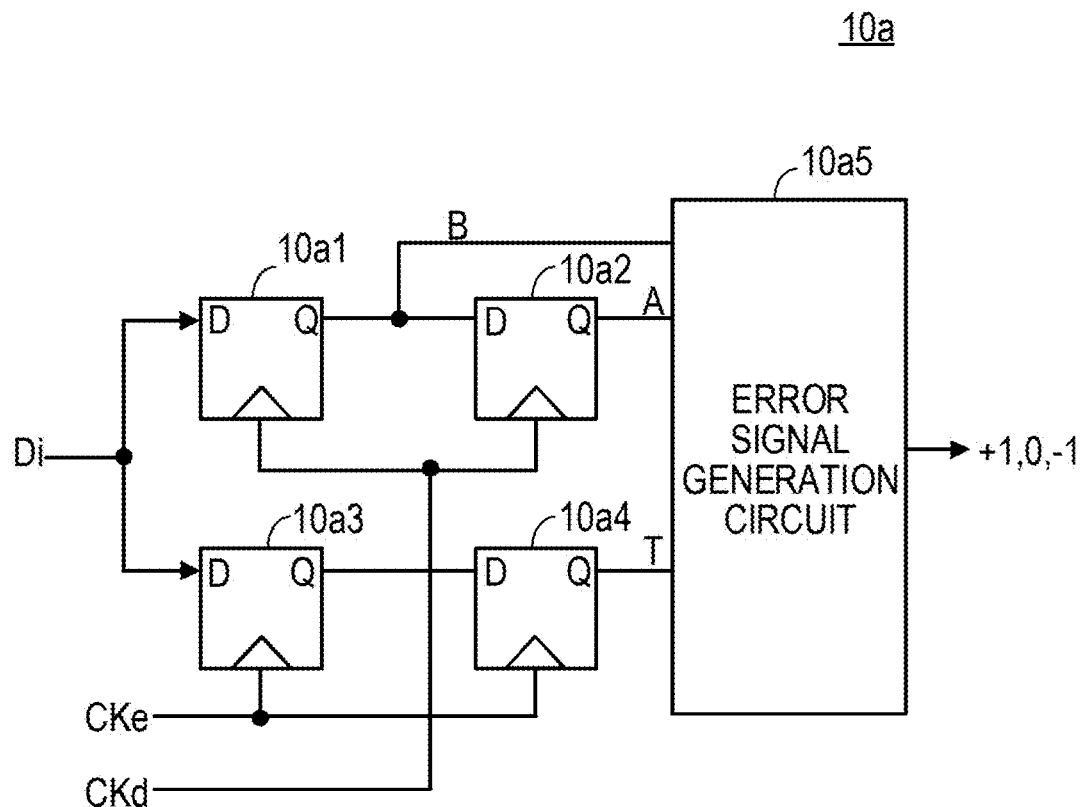
FIG. 2 is a view illustrating an example of a phase detection circuit.

FIG. 2 is a view illustrating an example of a phase detection circuit. The Bang-Bang type phase detection circuit 10a includes flip-flops 10a1, 10a2, 10a3, and 10a4 and an error signal generation circuit 10a5.

In FIG. 2, the data input terminals of the flip-flops 10a1 to 10a4 are denoted by "D," and the output terminals of the flip-flops 10a1 to 10a4 are denoted as "Q." The clock input terminals of the flip-flops 10a1 to 10a4 are denoted by triangular marks.

The data signal Di is input to the data input terminals of the flip-flops 10a1 and 10a3, and the output terminal of the flip-flop 10a1 is connected to the data input terminal of the flip-flop 10a2. The output terminal of the flip-flop 10a3 is connected to the data input terminal of the flip-flop 10a4. The clock signal CKd for data determination is supplied to the clock input terminals of the flip-flops 10a1 and 10a2, and the clock signal CKe is supplied to the clock input terminals of the flip-flops 10a3 and 10a4.

When the potential of a signal input to the data input terminals exceeds a threshold value Vth at a rising timing of the clock signal CKd, the flip-flops 10a1 and 10a2 output "1" (a potential whose logic level is high (H)). When the potential of the signal input to the data input terminal is lower than the threshold value Vth at the rising timing of the clock signal CKd, the flip-flops 10a1 and 10a2 output "0" (a potential whose logic level is low (L)). When the potential of a signal input to the data input terminal exceeds the threshold value Vth at the rising timing of the clock signal CKe, the flip-flops 10a3 and 10a4 output "1." When the potential of the signal input to the data input terminal is lower than the threshold value Vth at the rising timing of the clock signal CKe, the flip-flops 10a3 and 10a4 output "0."

The error signal generation circuit 10a5 outputs an error signal based on an output signal B of the flip-flop 10a1, an output signal A of the flip-flop 10a2, and an output signal T of the flip-flop 10a4. There are three types of error signals, +1, 0, and −1. The three types of error signals are represented by, for example, 2-bit values, as will be described later.

Figure 3:
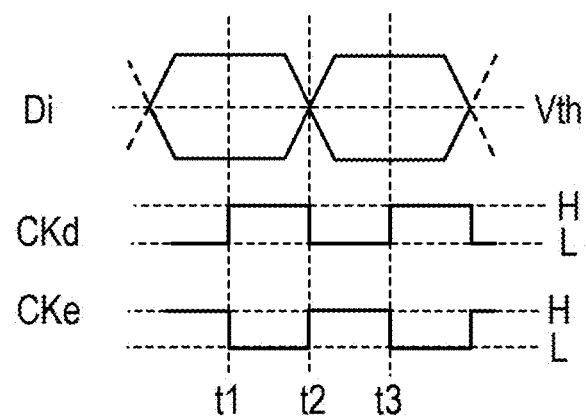
FIG. 3 is a timing chart illustrating an example of a data signal of two symbols and two types of clock signals.

FIG. 3 is a timing chart illustrating an example of a data signal of two symbols and two types of clock signals. In FIG. 3, the data signal Di is represented by an eye pattern in which data transitions are superimposed on each other. Further, in the example of FIG. 3, the clock signals CKd and CKe are adjusted to an ideal phase. That is, the phase of the clock signal CKe is adjusted such that the rising timing of the clock signal CKe comes to the edge portion (zero crossing point) of the data signal Di. Further, the clock signal CKd is adjusted such that the phase thereof is shifted by 0.5 UI from the phase of the clock signal CKe. Therefore, the rising timing of the clock signal CKd comes to the center timing of the eye pattern of the data signal Di.

In the example of FIG. 3, at a timing t1, the potential of the clock signal CKd rises from the L level to the H level. At this timing t1, the flip-flop 10a1 illustrated in FIG. 2 takes in and outputs the value of the data signal Di. Further, the flip-flop 10a2 takes in and outputs the output signal B of the flip-flop 10a1 at the timing t1. That is, the output signal A of the flip-flop 10a2 indicates a value one symbol before the value of the data signal Di indicated by the output signal B.

At a timing t2, the potential of the clock signal CKe rises from the L level to the H level. At this timing t2, the flip-flop 10a3 takes in and outputs the value of the data signal Di. Further, the flip-flop 10a4 takes in and outputs the output signal of the flip-flop 10a3 at the timing t2. That is, the output signal T of the flip-flop 10a2 indicates a value one symbol before the value of the data signal Di indicated by the output signal of the flip-flop 10a3.

At a timing t3, the potential of the clock signal CKd again rises from the L level to the H level again. At this timing t3, the flip-flop 10a1 takes in and outputs the value of the data signal Di. Further, the flip-flop 10a2 takes in and outputs the output signal B of the flip-flop 10a1 at the timing t3.

FIG. 4 is a view illustrating an example of input/output of the error signal generation circuit. When all the output signals A, T, and B have the same value, it indicates that there is no change in the value of the data signal Di of two symbols, and the error signal generation circuit 10a5 outputs a 2-bit value "00." This corresponds to 0 among the above-mentioned three types of error signals of +1, 0, and −1.

When the output signals A and T are 0 and the output signal B is 1 or when the output signals A and T are 1 and the output signal B is 0, it indicates that the rising timing of the clock signal CKe is earlier than the edge portion of the data signal Di, that is, the phase of the clock signal CKe leads. At this time, the error signal generation circuit 10a5 outputs a 2-bit value "01." This corresponds to −1 among the above-mentioned three types of error signals.

When the output signal A is 0 and the output signals T and B are 1 or when the output signal A is 1 and the output signals T and B are 0, it indicates that the rising timing of the clock signal CKe is later than the edge portion of the data signal Di, that is, the phase of the clock signal CKe lags. At this time, the error signal generation circuit 10a5 outputs a 2-bit value "10." This corresponds to +1 of the above-mentioned three types of error signals.

When the output signals A and B are 0 and the output signal T is 1 or when the output signals A and B are 1 and the output signal T is 0, it indicates that a glitch noise occurs. At this time, the error signal generation circuit 10a5 outputs a 2-bit value "11." This corresponds to 0 among the above-mentioned three types of error signals of +1, 0, and −1.

The error signal generation circuit 10a5 having the input/output relationship as illustrated in FIG. 4 may be implemented by using, for example, two exclusive OR circuits of two inputs and one output.

Example of Phase Adjustment Circuits 10c and 10d

Figure 5:
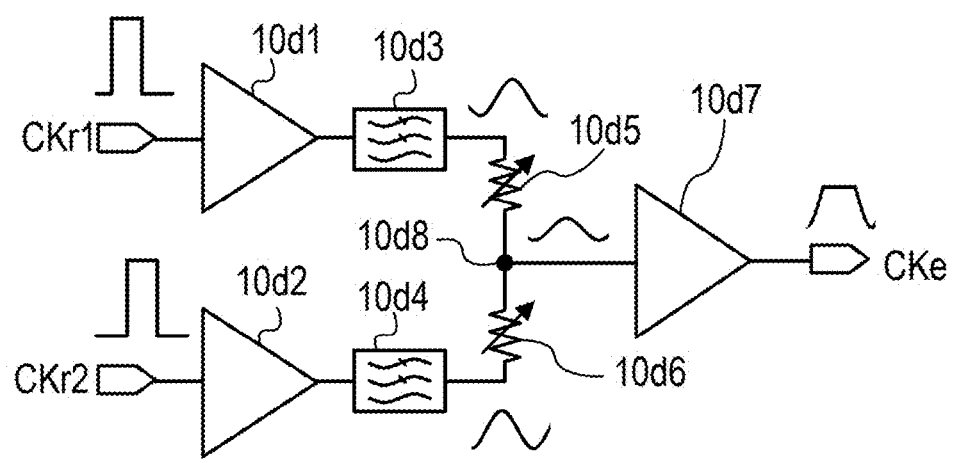
FIG. 5 is a view illustrating an example of a phase adjustment circuit.

FIG. 5 is a view illustrating an example of a phase adjustment circuit. Although FIG. 5 illustrates an example of the phase adjustment circuit 10d illustrated in FIG. 1, the phase adjustment circuit 10c may also be implemented by the same circuit. In addition, although two reference clocks CKr1 and CKr2 having different phases are supplied as the reference clock CKr illustrated in FIG. 1 to the phase adjustment circuit 10d of FIG. 5, a separate circuit may be provided to generate the reference clocks CKr1 and CKr2 based on the reference clock CKr. In addition, three or more reference clocks having different phases may be used.

The phase adjustment circuit 10d includes transconductors 10d1 and 10d2, low pass filters 10d3 and 10d4, variable resistive elements 10d5 and 10d6, and an amplifier 10d7. The transconductor 10d1 converts the reference clock CKr1 into a current value and outputs the current value. The transconductor 10d2 converts the reference clock CKr2 into a current value and outputs the current value.

The low pass filter 10*d*3 filters and outputs the output signal of the transconductor 10*d*1. The low pass filter 10*d*4 filters and outputs the output signal of the transconductor 10*d*2. As a result, the output waveforms of the low pass filters 10*d*3 and 10*d*4 are not rectangular but dull.

The variable resistive element 10*d*5 is connected between the output terminal of the low pass filter 10*d*3 and a node 10*d*8, and has a resistance value that varies based on the adjustment value. The variable resistive element 10*d*6 is connected between the output terminal of the low pass filter 10*d*4 and the node 10*d*8, and has a resistance value that varies based on the adjustment value.

The amplifier 10*d*7 amplifies the potential of the node 10*d*8 to generate the clock signal CKe which is a rectangular wave.

Figure 6:
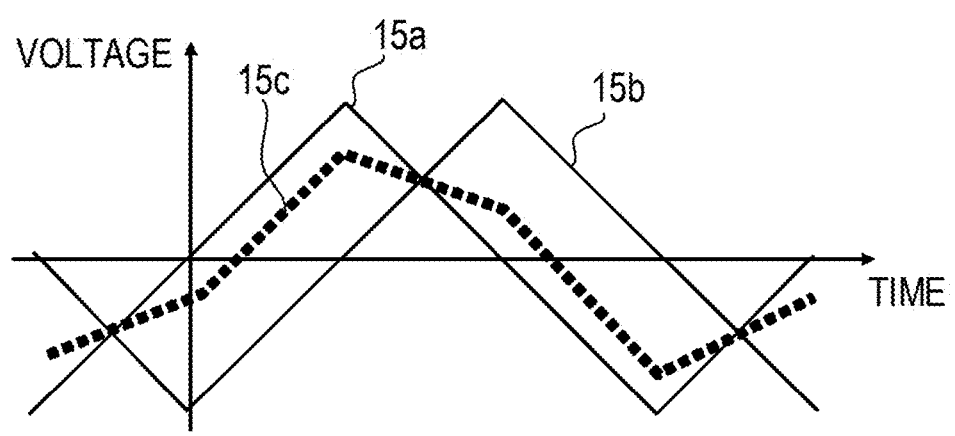
FIG. 6 is a view illustrating an example of phase adjustment based on an adjustment value.

FIG. 6 is a view illustrating an example of phase adjustment based on the adjustment value. In FIG. 6, the horizontal axis represents time and the vertical axis represents a voltage. A waveform 15*a* schematically illustrates an example of the output waveform of the low pass filter 10*d*3, and a waveform 15*b* schematically illustrates an example of the output waveform of the low pass filter 10*d*4 (these waveforms are actually dull as described above). A waveform 15*c* schematically illustrates an example of the potential of the node 10*d*8.

In the following description, it is assumed that the waveform 15*a* is represented by $\sin(t)$ (t is time), and the waveform 15*b* is represented by $\cos(t)$. Assuming that the ratio of the resistance values of the variable resistive element 10*d*5 and the variable resistive element 10*d*6 adjusted based on the adjustment value is $X:1-X$ (X is a weighting factor), the waveform 15*c* is expressed as $(1-X)\sin(t)+X\cos(t)$.

The phase of the output clock signal CKe may be changed by changing the weighting coefficient X based on the adjustment value.

Example of Autocorrelation Calculation Circuit 11*b*

Figure 7:
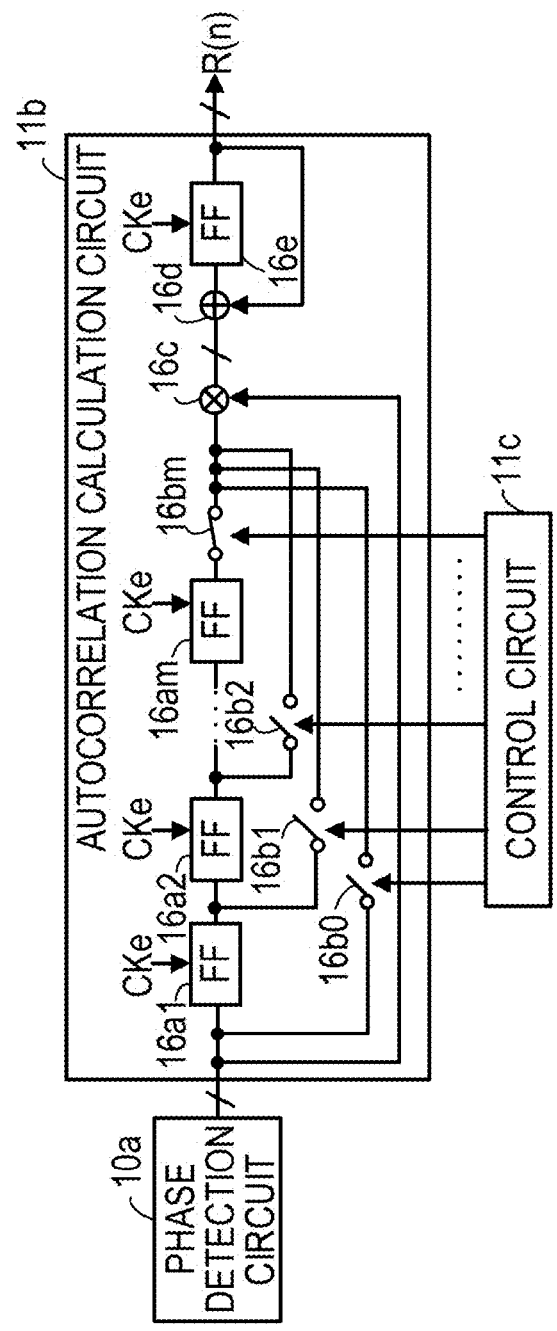
FIG. 7 is a view illustrating an example of an autocorrelation calculation circuit.

FIG. 7 is a view illustrating an example of an autocorrelation calculation circuit. The autocorrelation calculation circuit 11*b* includes flip-flop sections (denoted as "FF" in FIGS. 7) 16*a*1, 16*a*2, . . . , and 16*am*, switches 16*b*0, 16*b*1, 16*b*2, . . . , and 16*bm*, a multiplier 16*c*, an adder 16*d*, and a flip-flop 16*e*.

The m flip-flop sections 16*a*1 to 16*am* are connected in series and function as a delay circuit. The flip-flop sections 16*a*1 to 16*am* take in and output the signal of the data input terminal at a timing synchronized with the clock signal CKe. An error signal output by the phase detection circuit 10*a* is supplied to the data input terminal of the first-stage flip-flop section 16*a*1.

Each of the flip-flop sections 16*a*1 to 16*am* has two flip-flops, for example, so that a 2-bit error signal may be held. In addition, each of the flip-flop sections 16*a*1 to 16*am* is connected to the multiplier 16*c* via one of the switches 16*b*1 to 16*bm*. For example, the flip-flop section 16*a*1 is connected to the multiplier 16*c* via the switch 16*b*1, and the flip-flop section 16*a*2 is connected to the multiplier 16*c* via the switch 16*b*2. The input terminal of the first-stage flip-flop section 16*a*1 is connected to the multiplier 16*c* via the switch 16*b*0.

Such (m+1) switches 16*b*0 to 16*bm*, for example, receive a control signal output from the control circuit 11*c* and adjust the number of the flip-flop sections 16*a*1 to 16*am* to be validated based on the control signal to change the delay amount.

The multiplier 16*c* outputs a multiplication result obtained by multiplying error signals output by the phase detection circuit 10*a* by each other or multiplying an output signal of any of the flip-flop sections 16*a*1 to 16*am* by an error signal output by the phase detection circuit 10*a*. This multiplication result corresponds to the product of $PD_{OUT}(k)$ and $PD_{OUT}(k-n)$ in Equation (1).

For example, when the switch 16*b*0 is turned on and the switches 16*b*1 to 16*bm* are all turned off, all the flip-flop sections 16*a*1 to 16*am* are invalidated and the multiplier 16*c* outputs a multiplication result obtained by multiplying the error signals output by the phase detection circuit 10*a* by each other. This multiplication result corresponds to a case where n in $PD_{OUT}(k) \times PD_{OUT}(k-n)$ is 0, that is, the square of $PD_{OUT}(k)$.

In addition, among the switches 16*b*0 to 16*bm*, when all but the switch 16*bm* are turned off, all the flip-flop sections 16*a*1 to 16*am* are validated. In this case, the multiplier 16*c* outputs a multiplication result obtained by multiplying the error signal output from the phase detection circuit 10*a* by the output signal of the flip-flop section 16*am*. In a case where the delay amount by each of the flip-flop sections 16*a*1 to 16*am* is 1, this multiplication result corresponds to a case where n in $PD_{OUT}(k) \times PD_{OUT}(k-n)$ is m, that is, $PD_{OUT}(k) \times PD_{OUT}(k-m)$. At this time, the delay amount n becomes maximal.

The multiplication result output by the multiplier 16*c* becomes +1 when the inputs are both +1 (indicating that the phase of the clock signal CKe lags) or when the inputs are both −1 (indicating that the phase of the clock signal Cke leads). The multiplication result output by the multiplier 16*c* becomes −1 when one input is +1 and the other input is −1. The multiplication result output by the multiplier 16*c* is 0 when at least one of the inputs is 0.

The adder 16*d* outputs the addition result obtained by adding the multiplication result output by the multiplier 16*c* and the output signal of the flip-flop section 16*e*. The flip-flop section 16*e* takes in and outputs the addition result output by the adder 16*d* at the timing synchronized with the clock signal CKe. The output of the flip-flop unit 16*e* is the correlation value R(n).

Such a circuit including the adder 16*d* and the flip-flop section 16*e* functions as an integration circuit. The integration circuit has a function of averaging the multiplication results by integrating the multiplication results. For example, the correlation value R(n) which is the average value of the products of $PD_{OUT}(k)$ and $PD_{OUT}(k-n)$ in Equation (1) may be obtained by integrating the multiplication results for plural clock cycles (e.g., 100 clock cycles). Alternatively, the jitter calculation device 12 may calculate R(n) by dividing the integration of the multiplication results for plural clock cycles by the number of clock cycles.

When there is no autocorrelation in the error signal $PD_{OUT}(k)$, the frequencies at which +1 and −1 are supplied as the error signal $PD_{OUT}(k)$ are equal to each other, and as a result, the correlation value R(n) becomes substantially equal to 0. Meanwhile, when a rectangular wave signal having a positive value is added to the adjustment value, the phase of the clock signal CKe leads and the frequency at which −1 is supplied as the error signal $PD_{OUT}(k)$ to the autocorrelation calculation circuit 11*b* increases. As a result, the correlation value R(n) decreases.

Example of Operation of Jitter Measurement Using Jitter Measurement Circuit 11

An example of a jitter measurement operation using the jitter measurement circuit 11 of the first embodiment will be described below.

Figure 8:
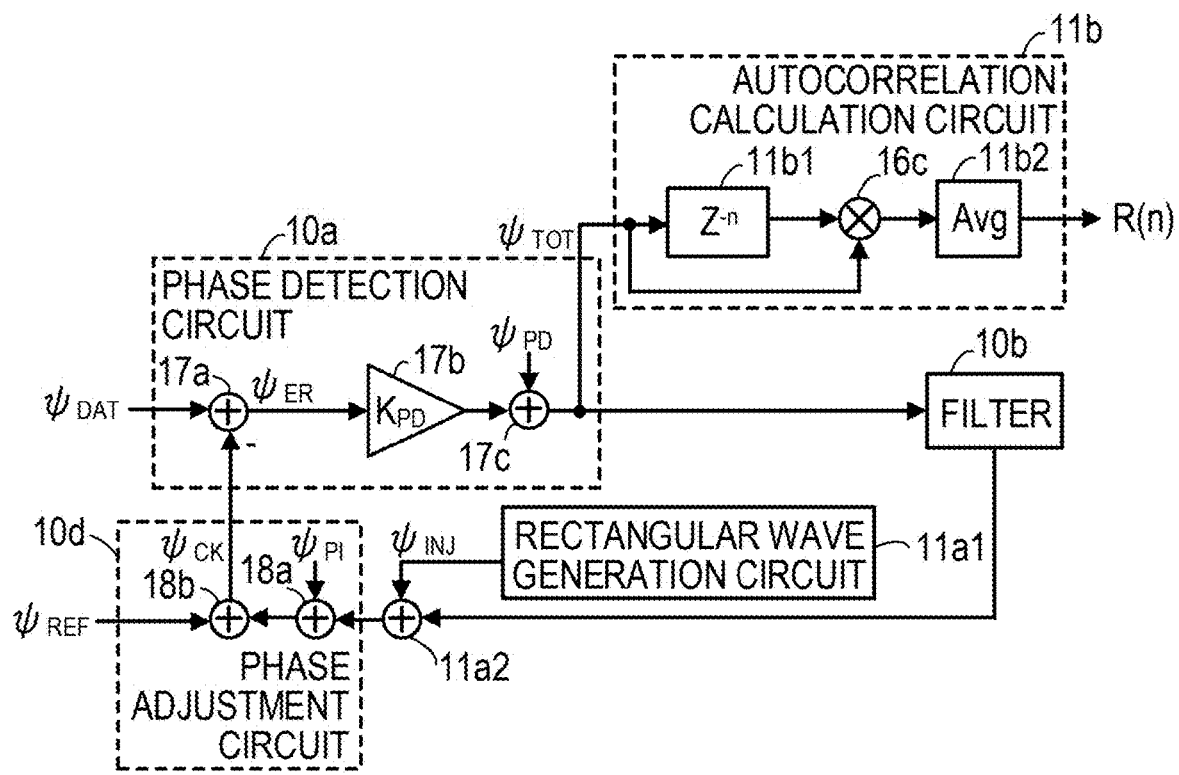
FIG. 8 is a view illustrating a relationship between a jitter generated in a clock generation circuit and an input jitter.

FIG. 8 is a view illustrating a relationship between a jitter generated in the clock generation circuit and an input jitter. In FIG. 8, the same elements as those illustrated in FIGS. 1 and 7 are denoted by the same reference numerals as used in FIGS. 1 and 7. Further, FIG. 8 illustrates adders 17a and 17c and an amplifier 17b included in the phase detection circuit 10a and adders 18a and 18b included in the phase adjustment circuit 10d, in order to represent addition or amplification of jitter. These adders are not actually provided. Further, in FIG. 8, a delay circuit (expressed as $Z^{-n}$) 11b1 included in the autocorrelation calculation circuit 11b corresponds to the portion including the flip-flop sections 16a1 to 16am and the switches 16b0 to 16bm illustrated in FIG. 7. An averaging circuit (expressed as Avg) 11b2 included in the autocorrelation calculation circuit 11b corresponds to the portion (integration circuit) including the adder 16d and the flip-flop section 16e illustrated in FIG. 7. The phase adjustment circuit 10c illustrated in FIG. 1 is not illustrated in FIG. 8.

Jitters to be input to the phase detection circuit 10a may include a jitter $\psi_{DAT}$ of the data signal Di and a jitter $\psi_{CK}$ of the clock signal CKe output by the phase adjustment circuit 10d. In the phase detection circuit 10a, a difference between the jitter $\psi_{DAT}$ and the jitter $\psi_{CK}$ is a jitter $\psi_{ER}$ which is the fluctuation of the phase of the clock signal CKe in the time axis direction with respect to the data signal Di. The jitter $\psi_{ER}$ is amplified with the gain $K_{PD}$ of the phase detection circuit 10a, and a jitter (quantization error jitter) $\psi_{PD}$ generated in the phase detection circuit 10a is added to the amplified jitter $\psi_{ER}$ to obtain a jitter $\psi_{TOT}$. The jitter $\psi_{TOT}$ propagates to the filter 10b and the autocorrelation calculation circuit 11b.

Meanwhile, a jitter propagated from the filter 10b to the adder 11a2 is added with a rectangular wave signal (jitter $\psi_{INJ}$) generated by the rectangular wave generation circuit 11a1. Further, a jitter $\Psi_{PI}$ generated in the phase adjustment circuit 10d and a jitter $\Psi_{REF}$ of the reference clock CKr are added to obtain a jitter $\Psi_{CK}$.

When the effective value $\sigma_{ER}$ of the jitter $\Psi_{ER}$ among the plurality of jitters becomes large, it is difficult to match the rising timing of the clock signal CKe with the edge of the data signal Di, as illustrated in FIG. 3. The jitter measurement circuit 11 of the first embodiment makes it possible to observe the effective value $\sigma_{ER}$ of the jitter $\Psi_{ER}$.

Figure 9:
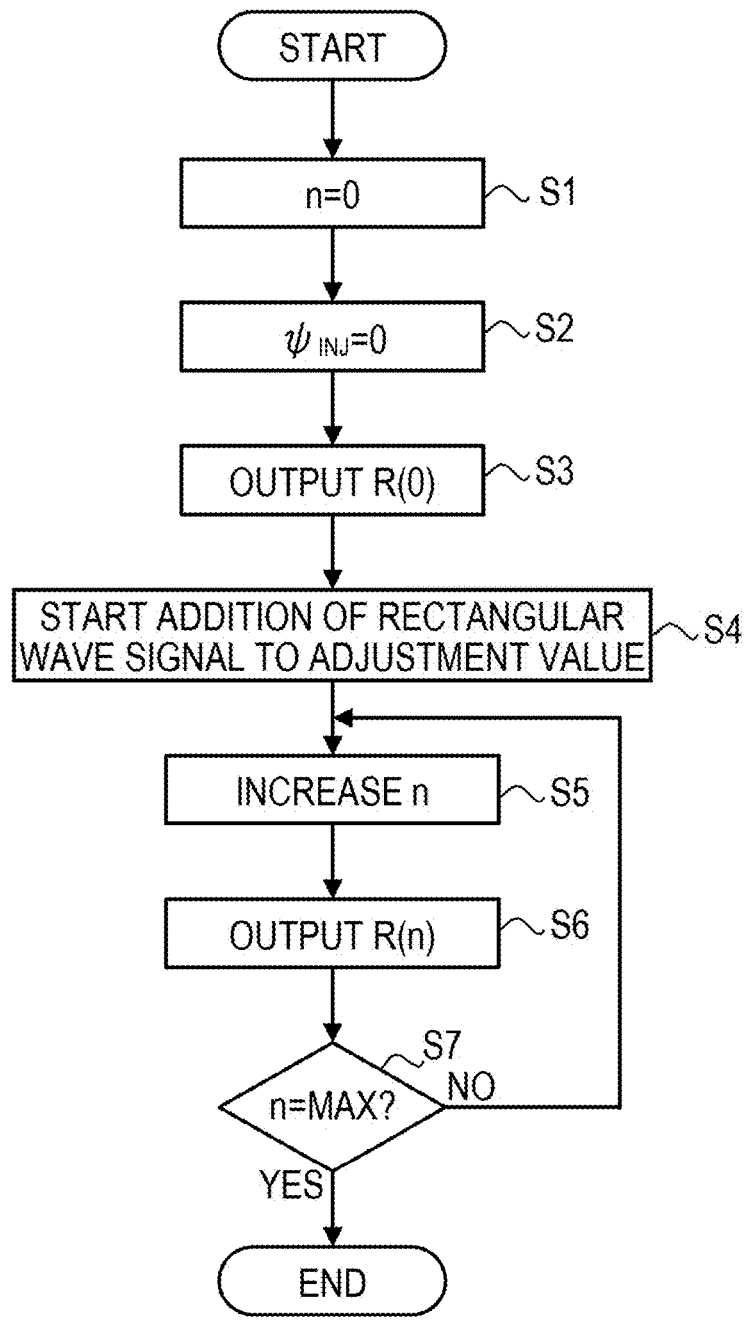
FIG. 9 is a flowchart (1) illustrating a flow of observation of an effective value $\sigma_{ER}$.
Figure 10:
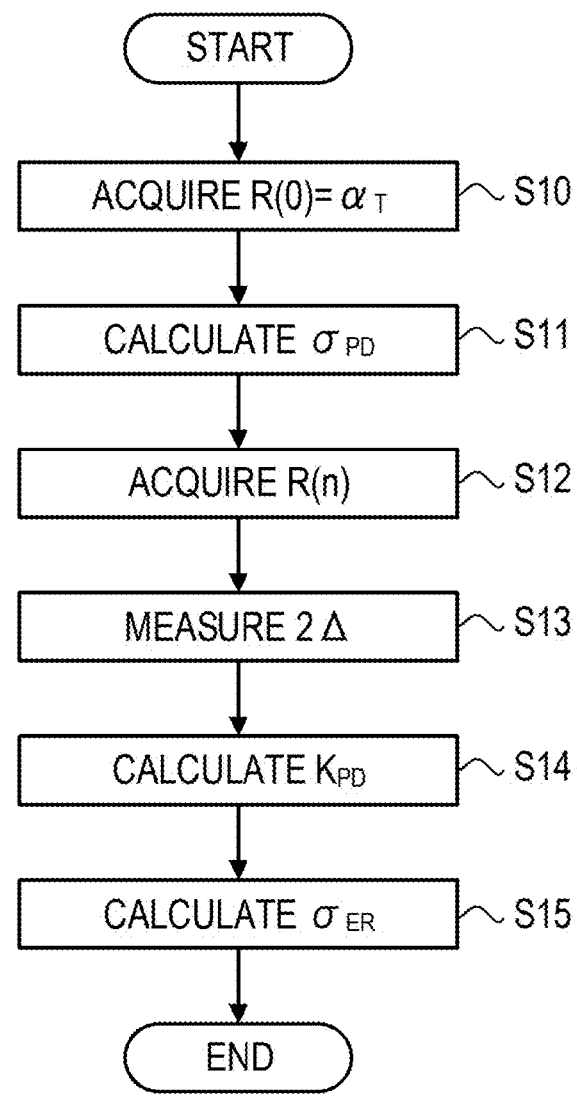
FIG. 10 is a flowchart (2) illustrating a flow of observation of an effective value $\sigma_{ER}$.

FIGS. 9 and 10 are flowcharts illustrating a flow of the observation of the effective value $\sigma_{ER}$. FIG. 9 illustrates the flow of a process by the jitter measurement circuit 11, and FIG. 10 illustrates the flow of a process by the jitter calculation device 12.

First, the control circuit 11c of the jitter measurement circuit 11 sets the delay amount n of the autocorrelation calculation circuit 11b to 0 (operation S1). For example, when the autocorrelation calculation circuit 11b as illustrated in FIG. 7 is used, the control circuit 11c turns on the switch 16b0 and turns off all the switches 16b1 to 16bm.

Further, the control circuit 11c controls the rectangular wave generation circuit 11a1 to stop the output of the rectangular wave signal. As a result, the jitter $\Psi_{INJ}$ becomes 0 (operation S2).

The autocorrelation calculation circuit 11b outputs R(0) which is the correlation value R(n) under the condition of n=0 and $\Psi_{INJ}$=0 (operation S3). As illustrated in FIG. 1, when no rectangular wave signal is added, a jitter $\psi_{ER}(k)$ appears in the form of random white noise, and the correlation value R(n)=0 except for R(0), that is, it is uncorrelated. When n=0, the multiplier 16c of the autocorrelation calculation circuit 11b squares the error signal output by the phase detection circuit 10a. This corresponds to calculating the transition probability $\alpha_T$ of the data signal Di.

The reason for calculating such R(0) (transition probability $\alpha_T$) will be explained below. Equation (1) may be expressed as the following equation (2).

$$R(n)=K_{PD}^2 E[\psi_{ER}(k)\psi_{ER}(k-n)]+\sigma_{PD}^2 n] \qquad (2)$$

In Equation (2), $\psi_{ER}(k)$ is a jitter $\psi_{ER}$ generated in the $k^{th}$ clock cycle of the clock signal Cke, and $\psi_{ER}(k-n)$ is a jitter $\psi_{ER}$ generated in the $(k-n)^{th}$ clock cycle of the clock signal CKe. The n corresponds to the delay amount in the delay circuit 11b1. The delay amount n means a delay of n clock cycles of the clock signal CKe. The $\sigma_{PD}$ is the effective value of the jitter $\psi_{PD}$. The δ[n] is a delta function, which is 1 when n=0 and 0 when n=0.

In Equation (2), in the case of n=0, R(0) is expressed by the following equation (3).

$$R(0)=\alpha_T = K_{PD}^2 \sigma_{ER}^2 + \sigma_{PD}^2 \qquad (3)$$

Therefore, when R(0), the gain $K_{PD}$ of the phase detection circuit 10a, and the effective value $\sigma_{PD}$ of the jitter $\Psi_{PD}$ are obtained, the effective value $\sigma_{ER}$ desired to be obtained may be calculated. This is the reason for calculating R(0).

When the jitter $\Psi_{PD}$ follows the Gaussian distribution, the gain $K_{PD}$ of the Bang-Bang type phase detection circuit 10a is expressed by the following equation (4) (see M. J. Park and J. Kim, "Pseudo-linear analysis of bang-bang controlled timing circuits," IEEE Transactions on Circuits and Systems I: Regular Papers, vol. 60, no. 6, pp. 1381-1394, June 2013).

$$K_{PD} = \sqrt{\frac{2}{\pi}} \frac{\alpha_T}{\sigma_{ER}} \qquad (4)$$

The following equation (5) is obtained from Equations (3) and (4).

$$\sigma_{PD} = \sqrt{\alpha_T - \frac{2}{\pi}\alpha_T^2} \qquad (5)$$

That is, the effective value $\sigma_{PD}$ may be obtained from R(0) (transition probability $\alpha_T$). Meanwhile, the gain $K_{PD}$ may be obtained by a process to be described later.

In operation S3, the control circuit 11c controls the delay amount n to be 0 by a predetermined number of clock cycles (e.g., 100 cycles) of the clock signal Cke. Then, the control circuit 11c controls the addition circuit 11a to start the addition of the rectangular wave signal to the adjustment value (operation S4).

Figure 11:
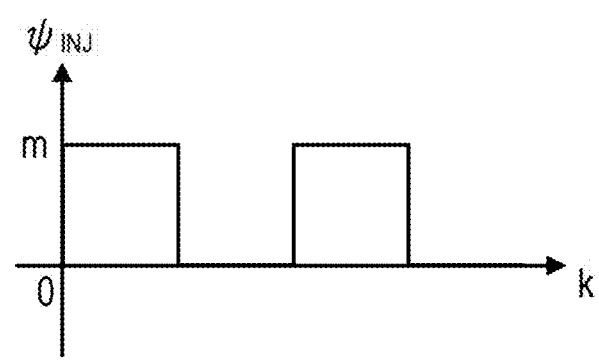
FIG. 11 is a view illustrating an example of a rectangular wave signal to be added.

FIG. 11 is a view illustrating an example of a rectangular wave signal to be added. In FIG. 11, the horizontal axis represents the clock cycle (k) of the clock signal Cke, and the vertical axis represents the jitter $\Psi_{INJ}$. As described above, for example, when the amplitude is m, the rectangular wave signal is a signal in which m and 0 are repeated at a duty ratio of 50%.

The control circuit 11c increases the delay amount n of the autocorrelation calculation circuit 11b (operation S5). For example, when the autocorrelation calculation circuit 11b as illustrated in FIG. 7 is used, the control circuit 11c turns on the switch 16b1 and turns off the switches 16b0 and 16b2 to 16bm.

The autocorrelation calculation circuit 11b outputs the correlation value R(n) each time the delay amount n increases (operation S6). In operation S6, the control circuit 11c controls the delay amount n to have the same value by a predetermined number of clock cycles (e.g., 100 cycles) of the clock signal Cke. Then, the control circuit 11c determines whether or not the delay amount n reaches the maximum value (MAX) (operation S7).

When it is determined that the delay amount n is not MAX, the process from operation S5 is repeated. For example, when the autocorrelation calculation circuit 11b as illustrated in FIG. 7 is used, the delay amount n becomes MAX when n=m. When it is determined that the delay amount n is not MAX, the control circuit 11c returns to operation S5 to increase the number of flip-flops that delay the error signal.

When the delay amount n is MAX, for example, the control circuit 11c controls the addition circuit 11a to stop the addition of the rectangular wave signal to the adjustment value and ends the jitter measurement. Meanwhile, as illustrated in FIG. 10, when R(0) (=$\alpha_T$) is acquired (operation S10), the jitter calculation device 12 calculates the effective value $\sigma_{PD}$ using the above-described equation (5) (operation S11).

Thereafter, the jitter calculation device 12 acquires the correlation value R(n) (operation S12).

Figure 12:
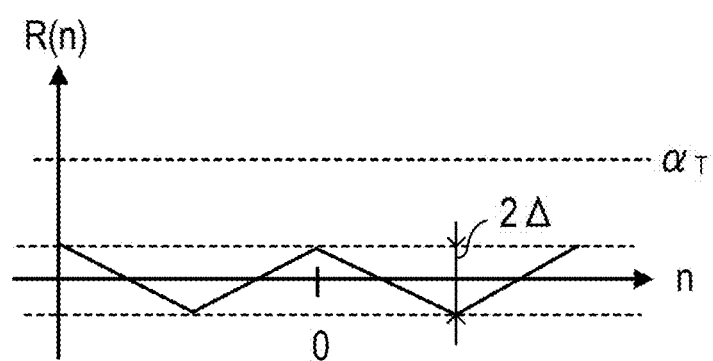
FIG. 12 is a view illustrating an example of a correlation value R(n) when a rectangular wave signal is added.

FIG. 12 is a view illustrating an example of the correlation value R(n) when a rectangular wave signal is added. In FIG. 12, the horizontal axis represents the delay amount n, and the vertical axis represents the correlation value R(n). FIG. 12 also illustrates the correlation value R(n) when the delay amount n is minus, for the sake of convenience.

The correlation value R(n) becomes a triangular wave as illustrated in FIG. 12 due to the influence of the rectangular wave signal as illustrated in FIG. 11. In the following description, it is assumed that the peak-to-peak amplitude of the correlation value R(n) is 2Δ. The relationship of the following equation (6) is established between Δ and the gain $K_{PD}$.

$$\Delta \approx K_{PD}^2 \sigma_{INJ}^2 \qquad (6)$$

Since the jitter $\Psi_{INJ}$ is a rectangular wave signal with a duty ratio of 50%, when the amplitude m of the rectangular wave signal as illustrated in FIG. 11 is set to 2A, the effective value $\sigma_{INJ}$ of the jitter $\Psi_{INJ}$ is A. Therefore, the gain $K_{PD}$ is obtained from Equation (6).

In order to obtain the gain $K_{PD}$, the jitter calculation device 12 measures 2Δ from the acquired correlation value R(n) (operation S13) and calculates the gain $K_{PD}$ using Equation (6) (operation S14).

In the case where the autocorrelation calculation circuit 11b as illustrated in FIG. 7 is used, the multiplication results of the multiplier 16c are integrated in synchronization with the clock cycle of the clock signal CKe and are output from the autocorrelation calculation circuit 11b. In operation S13, the jitter calculation device 12 measures 2Δ by using, for example, the integration of the multiplication results for a predetermined number of clock cycles (e.g., 100 cycles) as the correlation value R(n). In addition, the jitter calculation device 12 may divide the integration of the multiplication results for a predetermined number of clock cycles by the number of clock cycles and may use the result of the division as the correlation value R(n) to measure 2Δ.

In order to calculate the gain $K_{PD}$ using Equation (6), the jitter calculation device 12 has a value of the amplitude m (=2A) of the rectangular wave signal which is the effective value $\sigma_{INJ}$ of the jitter $\Psi_{INJ}$. For example, the value of the amplitude m (=2A) of the rectangular wave signal is held in a memory (not illustrated) in the jitter calculation device 12.

After operation S14, the jitter calculation device 12 calculates the effective value $\sigma_{ER}$ (operation S15). When the rectangular wave signal is added, the transition probability $\alpha_T$ can be expressed by the following equation (7).

$$R(0) = \sigma_T^2 = K_{PD}^2 [\sigma_{ER}^2 + \sigma_{INJ}^2] + \sigma_{PD}^2 \qquad (7)$$

In Equation (7), $\sigma_{INJ}^2$ is $A^2$.

In operation S15, the jitter calculation device 12 calculates the effective value $\sigma_{ER}$ from Equation (7) using the obtained gain $K_{PD}$ and effective value $\sigma_{PD}$, the acquired transition probability $\alpha_T$, and A which is stored in the memory (not illustrated).

From Equations (5), (6), and (7), the effective value $\sigma_{ER}$ is expressed by the following equation (8).

$$\sigma_{ER} \approx A \sqrt{\frac{2}{\pi} \frac{\alpha_T^2}{\Delta} - 1} \qquad (8)$$

The jitter calculation device 12 may calculate the effective value $\sigma_{ER}$ according to Equation (8) without calculating the gain $K_{PD}$ using Δ. The jitter calculation device 12 may store the calculated effective value $\sigma_{ER}$ in a memory (not illustrated) or may present the calculated effective value $\sigma_{ER}$ to a user by displaying the calculated effective value $\sigma_{ER}$ on a display device (not illustrated).

As a result, the user may take measures against jitter based on the effective value $\sigma_{ER}$. As described above, the jitter measurement circuit 11 of the first embodiment calculates the correlation value representing the autocorrelation of the error signal at the time of addition and non-addition of the rectangular wave signal to the adjustment value for adjusting the phase of the clock signal CKe. As described above, this correlation value reflects the jitter $\Psi_{ER}$, and the jitter calculation device 12 may calculate the effective value $\sigma_{ER}$ of the jitter $\Psi_{ER}$ based on the correlation value. In the CDR circuit having the eye monitor function, a jitter is measured from BER detected by using a circuit separate from a circuit which actually controls the phase of the clock signal used for data determination. Meanwhile, the jitter measurement circuit 11 may directly measure the jitter $\Psi_{ER}$ (effective value $\sigma_{ER}$) by using a signal propagating through a circuit that controls the phase of the clock signal actually used for data determination. Therefore, it is possible to more accurately evaluate the jitter $\Psi_{ER}$ that actually becomes problematic.

In addition, in the CDR circuit having the eye monitor function, a circuit of a relatively large circuit scale such as an eye sampler is used, but the jitter measurement circuit 11 of the first embodiment may measure the jitter with an additional circuit of a smaller scale. In addition, since the increase in circuit scale may be suppressed, the increase in power consumption may be suppressed accordingly.

Second Embodiment

Figure 13:
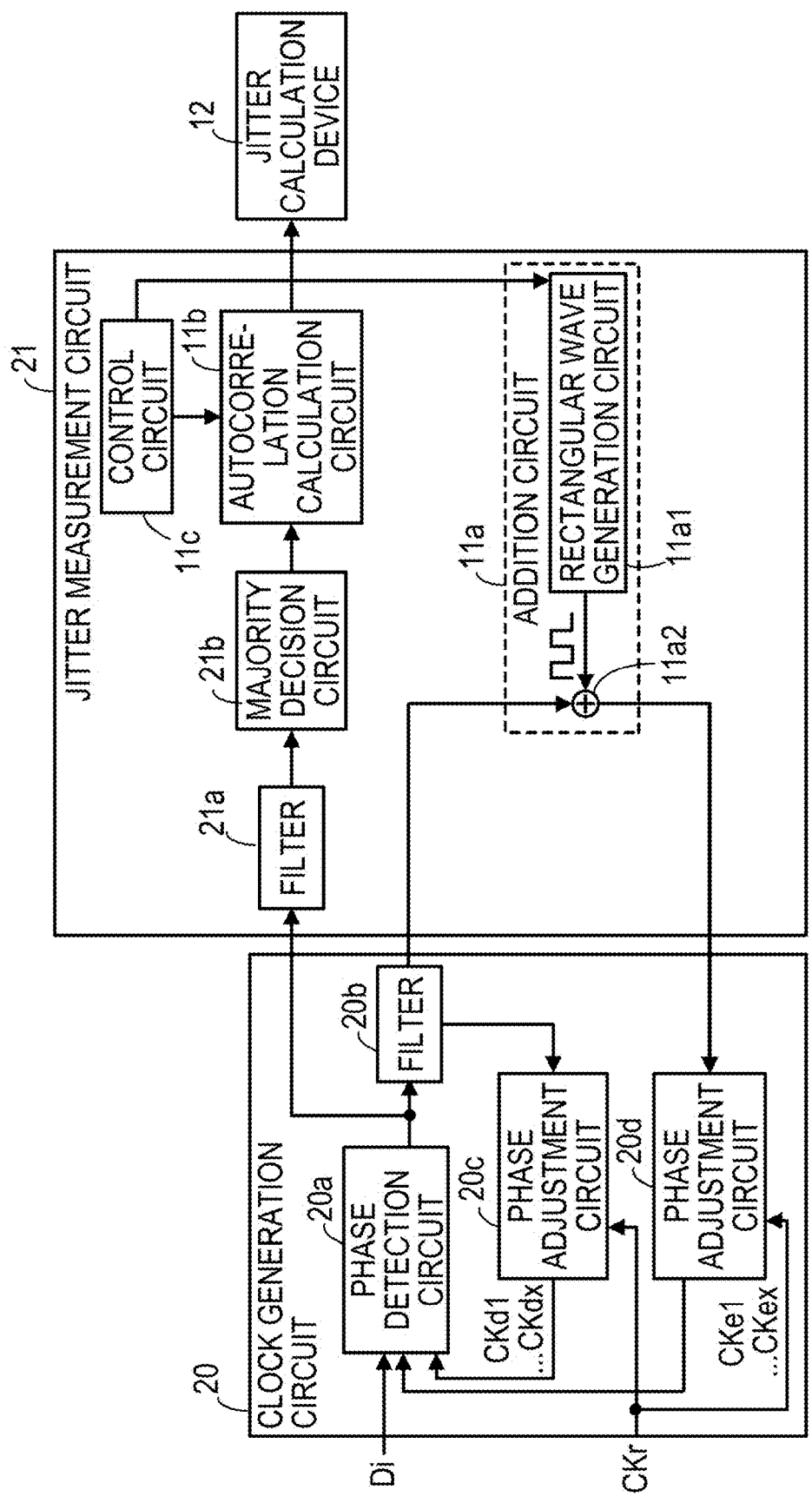
FIG. 13 is a view illustrating an example of a jitter measurement system including a jitter measurement circuit according to a second embodiment.

FIG. 13 is a view illustrating an example of a jitter measurement system including a jitter measurement circuit according to a second embodiment. In FIG. 13, the same elements as those illustrated in FIG. 1 are denoted by the same reference numerals as used in FIG. 1.

The jitter measurement circuit 21 according to the second embodiment processes plural error signals output in parallel by the clock generation circuit 20 operating in a time interleaving manner to output a correlation value. A phase detection circuit 20a of the clock generation circuit 20 operating in the time interleaving manner has plural phase detection circuits 10a as illustrated in FIG. 2, which operate in parallel in synchronization with clock signals CKd1 to CKdx and clock signals CKe1 to CKex. The phases of the clock signals CKe1 to CKex are different from each other. For example, the respective phases of the clock signals CKe1 to CKex are adjusted such that the rising timings thereof come to different zero-crossing points. The phase of each of the clock signals CKd1 to CKdx is shifted by 0.5 UI from the phase of the corresponding clock signal among the clock signals CKe1 to CKex.

The plural error signals are output in parallel from the phase detection circuit 20a. A filter 20b is, for example, a digital loop filter and filters the plural error signals output by the phase detection circuit 20a to output an adjustment value.

A phase adjustment circuit 20c adjusts the phases of the clock signals CKd1 to CKdx based on the adjustment value. A phase adjustment circuit 20d adjusts the phases of the clock signals CKe1 to CKex based on the adjustment value.

According to such a clock generation circuit 20, even when the frequency of the input data signal Di is high, a process may be performed using the low-speed clock signals CKd1 to CKdx and CKe1 to CKex.

The jitter measurement circuit 21 includes a filter 21a and a majority decision circuit 21b, in addition to the elements of the jitter measurement circuit 11 illustrated in FIG. 1. The filter 21a is a low pass filter and filters the plural error signals supplied in parallel from the phase adjustment circuit 20d. Thus, for example, it is possible to eliminate the influence of, for example, glitch noise as described above. The filter 21a may be omitted. In addition, such a filter 21a may also be installed in the jitter measurement circuit 11 of the first embodiment.

The majority decision circuit 21b receives the plural error signals output from the filter 21a and outputs the most frequent value (one of +1, 0, and −1) among the three types of values.

Figure 14:
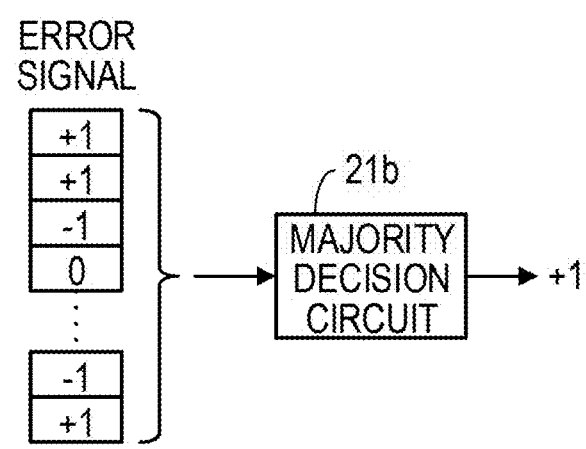
FIG. 14 is a view illustrating an example of the operation of a majority decision circuit.

FIG. 14 is a view illustrating an example of an operation of the majority decision circuit. In the example of FIG. 14, plural error signals having one of values of +1, 0, and −1 are supplied in parallel to the majority decision circuit 21b. When +1 is the most frequent among the error signals, the majority decision circuit 21b outputs +1 as illustrated in FIG. 14.

The majority decision circuit 21b may be implemented by using, for example, a logic circuit in which a plurality of NAND circuits and an OR circuit is combined with each other (see, e.g., Japanese Laid-Open Patent Publication No. 2010-273322) or a 2-bit adder.

The other operations of the jitter measurement circuit 21 are the same as those of the jitter measurement circuit 11 of the first embodiment. By using such a majority decision circuit 21b, the frequency of a clock signal supplied to each of the flip-flops (see FIG. 7) of the autocorrelation calculation circuit 11b may be reduced as the number of error signals output in parallel (the number of parallel signals) increases.

Further, according to the jitter measurement circuit 21 of the second embodiment, the same effects as the jitter measurement circuit 11 of the first embodiment are obtained. The Bang-Bang type phase detection circuits 10a and 20a are used in the jitter measurement circuit 11 of the first embodiment and the jitter measurement circuit 21 of the second embodiment as described above. However, the present disclosure is not limited thereto. A phase detection circuit that performs phase detection with one sampling per symbol may be used. Such a phase detection circuit is also called Muller-Muller (MM) type phase detection circuit.

Figure 15:
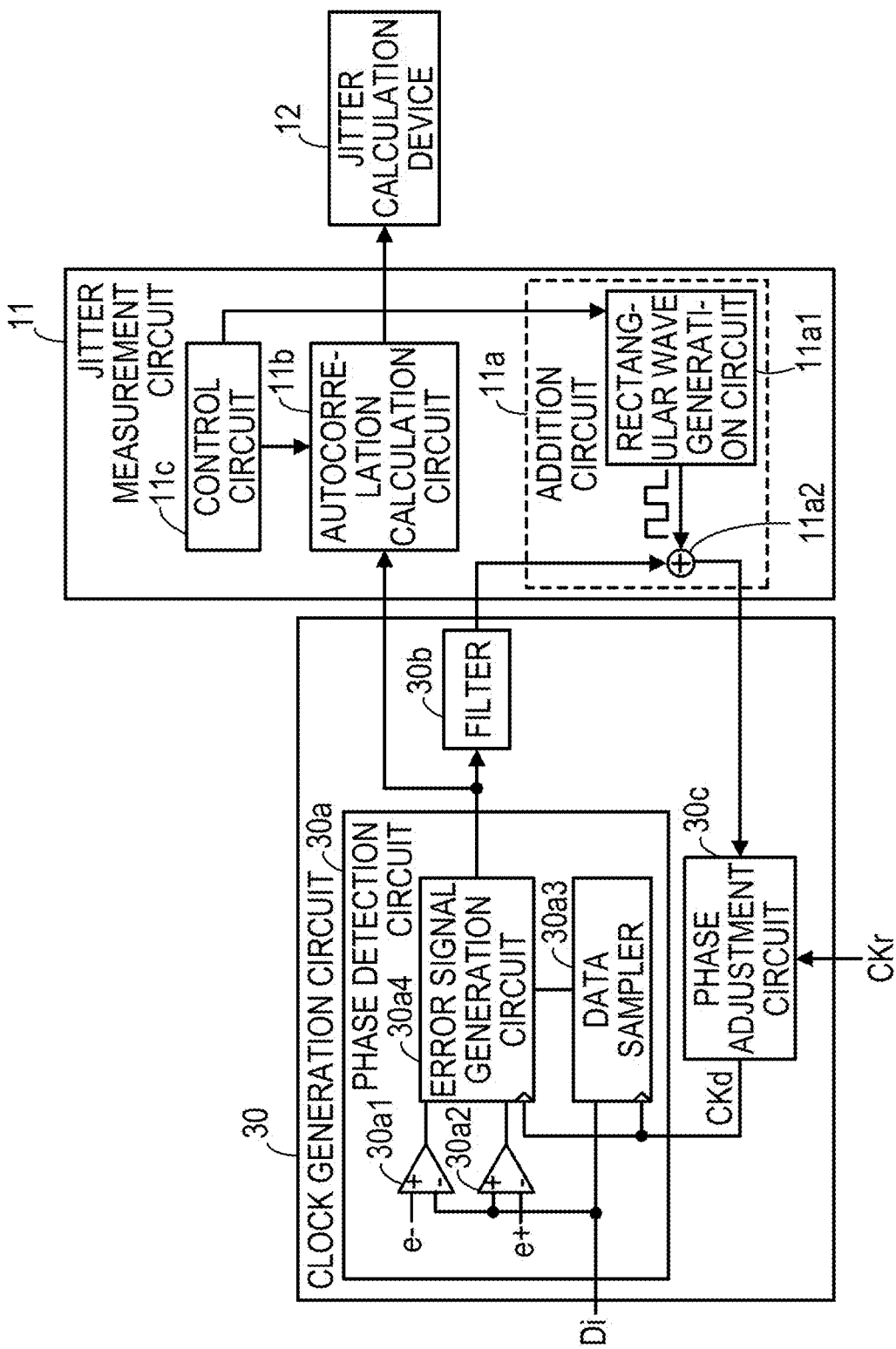
FIG. 15 is a view illustrating an example of application of an MM type phase detection circuit to a clock generation circuit.

FIG. 15 is a view illustrating an example of application of an MM type phase detection circuit to a clock generation circuit. A clock generation circuit 30 includes an MM type phase detection circuit 30a, a filter 30b, and a phase adjustment circuit 30c.

The MM type phase detection circuit 30a includes comparators 30a1 and 30a2, a data sampler 30a3, and an error signal generation circuit 30a4. The comparator 30a1 outputs a comparison result obtained by comparing a threshold value e− and the data signal Di. The comparator 30a1 outputs 1 when the data signal Di is larger than the threshold value e−, and outputs 0 when the data signal Di is smaller than the threshold value e−.

The comparator 30a2 outputs a comparison result obtained by comparing a threshold value e+ and the data signal Di. The comparator 30a2 outputs 1 when the data signal Di is larger than the threshold value e+, and outputs 0 when the data signal Di is smaller than the threshold value e+.

The data sampler 30a3 determines a value (0 or 1) based on the potential level of the data signal Di at the rising timing of the clock signal CKd.

The error signal generation circuit 30a4 takes in the determination result of the value of the data signal Di output by the data sampler 30a3 and the comparison results output by the comparators 30a1 and 30a2 at the rising timing of the clock signal CKd. Then, the error signal generation circuit 30a4 generates and outputs an error signal based on the determination result of the value of the data signal Di of two symbols output by the data sampler 30a3 and the comparison results of two symbols output by the comparators 30a1 and 30a2.

Figure 16:
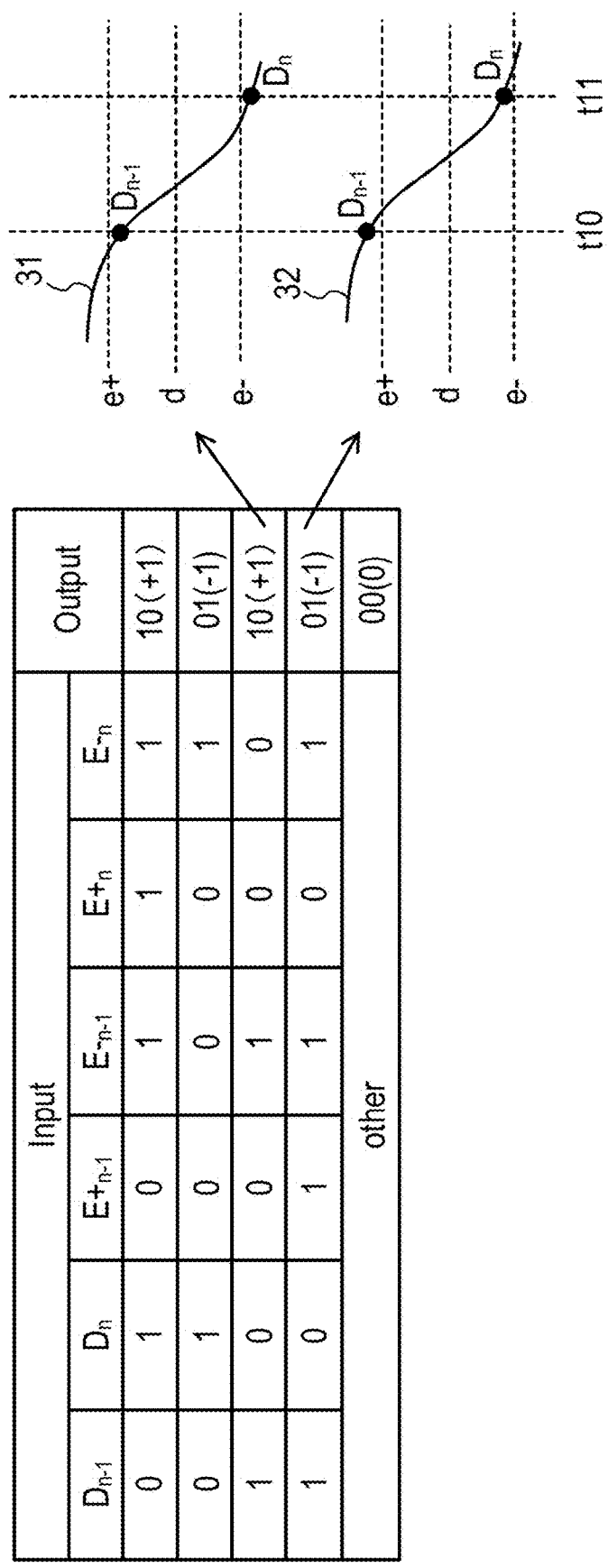
FIG. 16 is a view illustrating a relationship between inputs and outputs of an error signal generation circuit.

FIG. 16 is a view illustrating the relationship between input and output of the error signal generation circuit. Among the inputs of the error signal generation circuit 30a4, $D_{n-1}$ and $D_n$ are values output by the data sampler 30a3. $D_{n-1}$ is a value of the $(n-1)^{th}$ symbol of the data signal Di, and $D_n$ is a value of the $n^{th}$ symbol of the data signal Di. $E+_{n-1}$, $E-_{n-1}$, $E+_n$, and $E-_n$ are values output by the comparators 30a1 and 30a2. $E-_{n-1}$ is a comparison result output by the comparator 30a1 in the $(n-1)^{th}$ symbol of the data signal Di, and $E-_n$ is a comparison result output by the comparator 30a1 in the $n^{th}$ symbol of the data signal Di. $E+_{n-1}$ is a comparison result output by the comparator 30a2 in the $(n-1)^{th}$ symbol of the data signal Di, and $E+_n$ is a comparison result output by the comparator 30a2 in the $n^{th}$ symbol of the data signal Di. In addition, d is a threshold value used by the data sampler 30a3 to determine $D_{n-1}$ and $D_n$.

When $D_{n-1}$ and $E+_{n-1}$ are 0 and $D_n$, $E-_{n-1}$, $E+_n$, and $E-_n$ are 1 or when $D_{n-1}$ and $E-_{n-1}$ are 1 and $D_n$, $E+_{n-1}$, $E+_n$, and $E-_n$ are 0, the rising timing of the clock signal CKd is later than the edge portion of the data signal Di. That is, the phase of the clock signal CKd lags.

For example, as illustrated in FIG. 16, when the data signal Di makes a transition as indicated by a waveform 31, $D_{n-1}$ output by the data sampler 30a3 at a timing t10 is 1 and $D_n$ output by the data sampler 30a3 at a timing t11 is 0. $E-_{n-1}$ output by the comparator 30a1 at the timing t10 is 1, $E+_{n-1}$ output by the comparator 30a2 is 0, $E-_n$ output by the comparator 30a1 at the timing t11 is 0, and $E+_n$ output by the comparator 30a2 is 0. The timings t10 and t11 are the rising timing (sampling timing) of the clock signal CKd.

In such a case, since the phase of the clock signal CKd lags, the error signal generation circuit 30a4 outputs a 2-bit value "10." This corresponds to +1 of the above three types of error signals.

When $D_n$ and $E-_n$ are 1 and $D_{n-1}$, $E+_{n-1}$, $E-_{n-1}$, and $E+_n$ are 0 or when $D_n$ and $E+_n$ are 0 and $D_{n-1}$, $E+_{n-1}$, $E-_{n-1}$, and $E-_n$ are 1, the rising timing of the clock signal CKd is earlier than the edge portion of the data signal Di. That is, the phase of the clock signal CKd leads.

For example, as illustrated in FIG. 16, when the data signal Di makes a transition as indicated by a waveform 32, $D_{n-1}$ output by the data sampler 30a3 at the timing t10 is 1 and $D_n$ output by the data sampler 30a3 at the timing t11 is 0. $E-_{n-1}$ output by the comparator 30a1 at the timing t10 is 1, $E+_{n-1}$ output by the comparator 30a2 is 1, $E-_n$ output by the comparator 30a1 at the timing t10 is 1, and $E+_n$ output by the comparator 30a2 is 0.

In such a case, since the phase of the clock signal CKd leads, the error signal generation circuit 30a4 outputs a 2-bit value "01." This corresponds to −1 of the above three types of error signals.

For other inputs of the error signal generation circuit 30a4, the error signal generation circuit 30a4 outputs a 2-bit value "00." This corresponds to 0 among the above three types of error signals of +1, 0, and −1.

When the MM type phase detection circuit 30a is used, the addition circuit 11a of the jitter measurement circuit 11 has a function of adding a rectangular wave signal to the adjustment value output by the filter 30b. The adjustment value to which the rectangular wave signal is added is supplied to the phase adjustment circuit 30c for adjusting the phase of the clock signal CKd. Then, the jitter measurement circuit 11 outputs the correlation value R(0) and the correlation value R(n) according to the same operation as the above-mentioned operation, and the jitter calculation device 12 calculates the effective value $\sigma_{ER}$.

The calculated effective value $\sigma_{ER}$ is the effective value of the jitter $\psi_{ER}$ that is the fluctuation of the phase of the clock signal CKd in the time axis direction with respect to the data signal Di. In this way, when the MM type phase detection circuit 30a is used instead of the Bang-Bang type phase detection circuit 10a, the same effects may also be obtained by the jitter measurement circuit 11.

That is, it is possible to directly measure the jitter $\Psi_{ER}$ (effective value $\sigma_{ER}$) by using a signal propagating through a circuit that controls the phase of the clock signal actually used for data determination. Therefore, it is possible to more accurately evaluate the jitter $\Psi_{ER}$ that actually becomes problematic.

It is also possible to operate the above-mentioned plural phase detection circuits 30a installed in parallel in the time interleaving manner, like the clock generation circuit 20 of the second embodiment. In that case, a jitter measurement circuit 21 as illustrated in FIG. 13 is used.

In the above description, the clock generation circuits 10, 20, and 30 functioning as a CDR circuit are used. However, the clock generation circuits are not limited to the CDR circuit but may be a phase locked loop (PLL) circuit.

Figure 17:
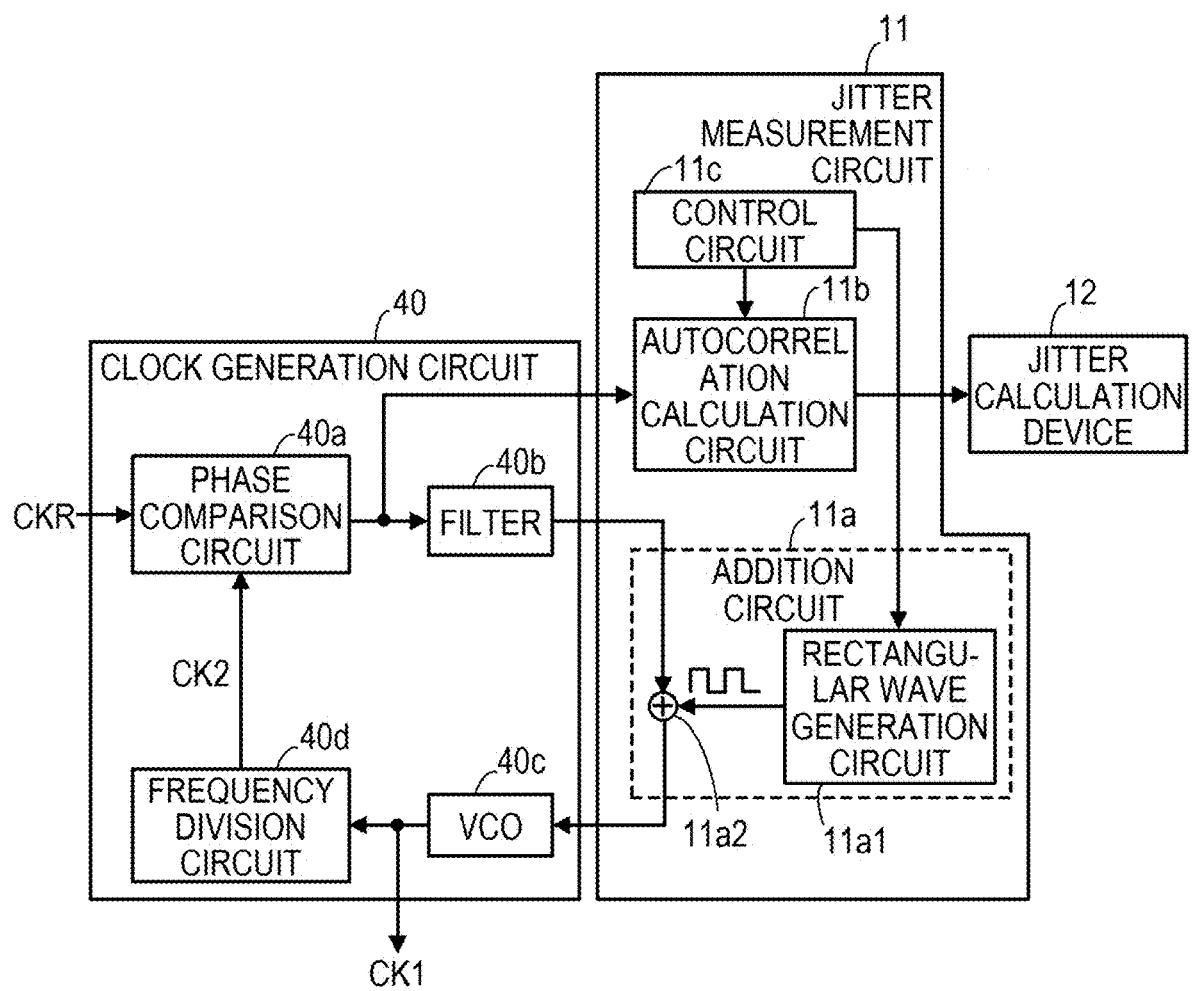
FIG. 17 is a view illustrating an example of a jitter measurement system that performs jitter measurement using a clock generation circuit functioning as a PLL circuit.

FIG. 17 is a view illustrating an example of a jitter measurement system that performs jitter measurement using a clock generation circuit that functions as a PLL circuit. A clock generation circuit 40 includes a phase comparison circuit 40a, a filter 40b, a voltage-controlled oscillator (VCO) 40c and a frequency division circuit 40d.

The phase comparison circuit 40a generates and outputs an error signal based on a phase difference between a clock signal (reference clock) CKR and a clock signal CK2 output by the frequency division circuit 40d. The filter 40b filters the error signal output by the phase comparison circuit 40a and outputs an adjustment value.

The VCO 40c outputs a clock signal CK1 whose frequency is adjusted based on the adjustment value output by the filter 40b. A rectangular wave signal may be added to the adjustment value supplied to the VCO 40c by the addition circuit 11a of the jitter measurement circuit 11 described above.

The frequency division circuit 40d divides the frequency of the clock signal CK1 to generate a clock signal CK2. When the clock generation circuit 40 functioning as a PLL circuit is used, the addition circuit 11a of the jitter measurement circuit 11 has a function of adding a rectangular wave signal to the adjustment value output by the filter 40b. The adjustment value to which the rectangular wave signal is added is supplied to the VCO 40c which adjusts the frequency of the clock signal CK1. Then, the jitter measurement circuit 11 outputs the correlation value R(0) and the correlation value R(n) according to the same operation as the above-mentioned operation, and the jitter calculation device 12 calculates the effective value $\sigma_{ER}$.

The calculated effective value $\sigma_{ER}$ is the effective value of the jitter $\psi_{ER}$ that is the fluctuation of the phase of the clock signal CK2 in the time axis direction with respect to the clock signal CKR. In this way, when the clock generation circuit 40 functioning as a PLL circuit is used, the jitter measurement circuit 11 may also directly measure the jitter $\Psi_{ER}$ (effective value $\sigma_{ER}$) by using a signal propagating through a circuit that controls the phase of the generated clock signal CK1. Therefore, it is possible to more accurately evaluate the jitter $\Psi_{ER}$ that actually becomes problematic.

Although one aspect of a jitter measurement circuit of the present disclosure has been described above by way of embodiments, these embodiments are merely examples and are not limited to those described above.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A jitter measurement circuit comprising:
an addition circuit configured to selectively add a digital rectangular signal to an adjustment signal generated by a clock generation circuit that generates a first error signal based on a phase difference between a first clock signal or a data signal on which the first clock signal is superimposed and a second clock signal and generates the adjustment signal by filtering the first error signal, the clock generation circuit adjusting a phase or a frequency of the second clock signal based on the adjustment signal; and
a calculation circuit configured to calculate a first correlation value for representing an autocorrelation of the first error signal when the digital rectangular signal is not added to the adjustment signal, and a second correlation value for representing an autocorrelation of the first error signal when the digital rectangular signal is added to the adjustment signal, based on the first error signal and a second error signal obtained by delaying the first error signal by a variable delay amount, and output the first correlation value and the second correlation value;

wherein the calculation circuit is configured to calculate the first correlation value when the delay amount is 0 and the digital rectangular signal is not added to the adjustment signal, and calculate the second correlation value when the digital rectangular signal is added to the adjustment signal with each value of the delay amount when the delay amount is changed.

2. The jitter measurement circuit according to claim 1, wherein the calculation circuit includes:
a delay circuit configured to output the second error signal obtained by delaying the first error signal;
a multiplier configured to output multiplication results obtained by multiplying the first error signal and the second error signal; and
an averaging circuit configured to average the multiplication results to generate the first correlation value or the second correlation value.

3. The jitter measurement circuit according to claim 2, wherein the delay circuit includes:
a plurality of flip-flops configured to delay the first error signal and output the second error signal; and
a plurality of switches configured to adjust a number of the flip-flops to be validated, based on a control signal, so as to change an amount of the delay.

4. The jitter measurement circuit according to claim 2, wherein the averaging circuit is an integration circuit configured to integrate the multiplication results and output the first correlation value or the second correlation value.

5. The jitter measurement circuit according to claim 1, wherein the calculation circuit is configured to receive, from the clock generation circuit, a plurality of error signals each of which is one of three types of values corresponding to respective phase differences between a plurality of clock signals having different phases and the data signal, and calculate the first correlation value or the second correlation value using a most frequent value among the three types of values as the first error signal.

6. The jitter measurement circuit according to claim 5, wherein the calculation circuit is configured to include a majority decision circuit configured to receive the plurality of error signals and output the most frequent value among the three types of values.

7. A jitter measurement system comprising:
a clock generation circuit configured to:
generate a first error signal based on a phase difference between a first clock signal or a data signal on which the first clock signal is superimposed and a second clock signal,
generate an adjustment signal by filtering the first error signal, and
adjust a phase or a frequency of the second clock signal based on the adjustment signal;
a jitter measurement circuit including:
an addition circuit configured to selectively add a digital rectangular signal to the adjustment signal generated by the clock generation circuit, and
a calculation circuit configured to calculate a first correlation value for representing an autocorrelation of the first error signal when the digital rectangular signal is not added to the adjustment signal, and a second correlation value for representing an autocorrelation of the first error signal when the digital rectangular signal is added to the adjustment signal, based on the first error signal and a second error signal obtained by delaying the first error signal by a variable delay amount, and output the first correlation value and the second correlation value; and
a jitter calculation processor configured to calculate a standard deviation of a jitter, which is a fluctuation in a phase on a time domain of the second clock signal comparable to the first clock signal or the data signal, based on the first correlation value, the second correlation value, and a first amplitude value of the digital rectangular signal.

8. The jitter measurement system according to claim 7, wherein the jitter calculation processor is configured to:
measure a second amplitude value of the second correlation value when the delay amount is changed, and
calculate the standard deviation based on the first amplitude value, the second amplitude value, and the first correlation value.

* * * * *